United States Patent
Ishizaki

(10) Patent No.: US 7,049,885 B2
(45) Date of Patent: May 23, 2006

(54) VOLUME ADJUSTMENT DEVICE, DIGITAL AMPLIFIER, AND DIGITAL SIGNAL REPRODUCING DEVICE

(75) Inventor: Hiroyuki Ishizaki, Higashihiroshima (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/500,276

(22) PCT Filed: Jul. 25, 2003

(86) PCT No.: PCT/JP03/09504

§ 371 (c)(1),
(2), (4) Date: Jun. 29, 2004

(87) PCT Pub. No.: WO2004/015855

PCT Pub. Date: Feb. 19, 2004

(65) Prior Publication Data

US 2005/0122162 A1 Jun. 9, 2005

(30) Foreign Application Priority Data

Jul. 29, 2002 (JP) .............................. 2002-220208
Mar. 17, 2003 (JP) .............................. 2003-072288

(51) Int. Cl.
*H03F 3/38* (2006.01)
(52) U.S. Cl. ........................................ 330/10; 330/251
(58) Field of Classification Search ................ 330/10, 330/207 A, 251
See application file for complete search history.

(56) References Cited

U.S. PATENT DOCUMENTS

| 5,182,527 A | * | 1/1993 | Nakanishi et al. | 330/285 |
| 5,990,751 A | * | 11/1999 | Takita | 330/297 |
| 6,683,496 B1 | * | 1/2004 | Poggi et al. | 330/132 |

FOREIGN PATENT DOCUMENTS

| JP | 61-251214 A | 11/1986 |
| JP | 6-335082 A | 12/1994 |
| JP | 7-29356 A | 1/1995 |
| JP | 2538277 B2 | 9/1996 |
| JP | 2000-22458 A | 1/2000 |
| JP | 2000-332553 A | 11/2000 |
| JP | 2000-339875 A | 12/2000 |
| JP | 2001-202696 A | 7/2001 |
| JP | 2001-257547 A | 9/2001 |

* cited by examiner

*Primary Examiner*—Henry Choe
(74) *Attorney, Agent, or Firm*—Birch, Stewart, Kolasch & Birch, LLP

(57) ABSTRACT

A digital amplifier causes a gate drive circuit to drive output transistors, and switches a power source voltage supplied from a variable voltage power source, thereby amplifying an amplitude of a 1-bit digital signal outputted from a ΔΣ block. A variable voltage power source varies a driving voltage, by which an upper gate drive circuit drives output transistors, as a voltage obtained by adding (i) a constant voltage supplied to a lower gate drive circuit to (ii) a power source voltage, so as to correspond to the power source voltage. Thus, the driving voltage is minimized without influencing a switching operation of the output transistors. As a result, it is possible to reduce power consumption of the upper gate drive circuit in turning down the volume.

5 Claims, 11 Drawing Sheets

VOLUME ADJUSTMENT DEVICE, DIGITAL AMPLIFIER, AND DIGITAL SIGNAL REPRODUCING DEVICE

TECHNICAL FIELD

The present invention relates to volume control of a digital amplifier constituted of a D-class amplifier or the like which drives a switching element by using a PDM (Pulse Density Modulation) signal or a PWM (Pulse Width Modulation) signal and performs high-efficiency power amplification of an audio signal by using the switching element in a saturation range.

BACKGROUND ART

Conventionally, a high-efficiency power amplifier described above is categorized into the following arrangements: (i) an arrangement in which an amplitude of a signal is adjusted in a signal source, and (ii) an arrangement in which an amplitude of a signal is adjusted in an amplifier section for amplifying a 1-bit digital signal that has been subjected to digital sigma modulation. FIG. 8 shows a high-efficiency power amplifier having the former arrangement, and FIG. 9 shows a high-efficiency power amplifier having the latter arrangement.

In the arrangements shown in FIG. 8 and FIG. 9, a digital audio signal that has been outputted from a digital signal source 101 is subjected to ΔΣ modulation by means of a ΔΣ modulation circuit 102, so that thus modulated signal becomes a 1-bit digital signal, and is supplied to a gate drive circuit 103. The gate drive circuit 103 outputs a gate drive signal on the basis of the 1-bit digital signal, and drives a power MOSFET constituting an output full-bridge circuit 104. In the output full-bridge circuit 104, it is possible to obtain the 1-bit digital signal, that has been subjected to power amplification, in accordance with a switching operation of the power MOSFET. Then, the 11-bit digital signal that has been amplified is converted into an analog audio signal after passing through a low pass filter 105, and thus converted signal is outputted as a sound by an output device 106 such as a head phone.

In an arrangement of FIG. 8, due to an amplitude adjusting signal supplied by a micro computer 107, the digital signal source 101 controls an amplitude of the audio signal for each volume step. Further, in the output full-bridge circuit 104, a constant power source voltage is supplied from a fixed-voltage power source 108 to a power source terminal of the output full-bridge circuit 104, so that the 1-bit digital signal is not subjected to amplitude adjustment.

Japanese Unexamined Patent Publication No. 332553/2000 (Tokukai 2000-332553)(Publication date: Nov. 30, 2000) relates to the arrangement of FIG. 8. In a 1-bit digital amplifier recited in this document, a digital audio signal or an analog audio signal is varied as an input signal by a level control device. However, the 1-bit digital amplifier is different from the arrangement of FIG. 8 in that: a difference between a signal whose amplitude level has been changed and a feedback signal that has been negatively fed-back from a pulse amplifier via a feedback circuit is quantized by a ΔΣ modulation section as 1 bit.

Meanwhile, in an arrangement of FIG. 9, the digital signal source 101 does not adjust an amplitude of an audio signal, but a power source voltage of a variable voltage power source 109 is controlled for each step of setting the volume in accordance with an analog power source control voltage supplied by the micro computer 107. Thus, in the output full-bridge circuit 104, a variable power source voltage controlled by a fixed-voltage power source 109 is provided to a power source terminal of the output full-bridge circuit 104, so that the 1-bit digital signal is subjected to amplitude adjustment.

In an arrangement of FIG. 9, as shown by Δ of FIG. 10, an amplitude level (input level) of an input signal from the digital signal source 101 is constant, and as shown by □ and ◊, a level of a power source voltage of the variable voltage power source 109 and an amplitude level (output level) of an output of the output full-bridge circuit 104 vary substantially in the same manner.

Note that, a document relating to the arrangement of FIG. 9 was not found.

FIG. 11 is a block diagram showing an arrangement of a conventional digital amplifier 201 as a high-efficiency amplifier having an arrangement similar to the arrangement of FIG. 9.

The digital amplifier 201 converts an analog sound signal into a 1 bit digital signal by a ΔΣ block 202, and performs power amplification (amplitude conversion) with respect to the 1 bit digital signal, and low pass filters 203 and 204 convert the 1 bit digital signal into an analog signal, thereby performing power amplification with high efficiency as described above. In an output drive circuit 205, the power amplification is performed by causing (i) a series circuit of output transistors Q201 and Q202 each of which is constituted of NMOSFET intervening between a high-level power source line 206 and a low-level power source line 207 and (ii) a series circuit of output transistors Q203 and Q204 each of which is constituted of NMOSFET intervening between the high-level power source line 206 and the low-level power source line 207 to perform a push-pull operation. The output transistors Q201 to Q204 operate in a saturation range, so that it is possible to perform power amplification with high efficiency as described above.

Thus, a 1-bit signal supplied from the ΔΣ block 202 is inputted to an upper gate drive circuit 208, and the output transistors Q201 and Q203 are driven by a positive phase component and a negative phase component that are generated here. The other 1-bit signal from the ΔΣ block 202 is inputted to a lower gate drive circuit 209, and the output transistors Q202 and Q204 are driven by a positive phase component and a negative phase component that are generated here. By the gate drive circuits 208 and 209, a combination of the output transistors Q201 and Q204 that are positioned diagonally with respect to each other is driven at the same phase, and a combination of the output transistors Q202 and Q203 is driven at the same phase, and (i) the combination of the output transistors Q201 and Q204 and (ii) the combination of the output transistors Q202 and Q203 are driven at phases opposite to each other, thereby realizing the push-pull operation.

Further, a variable direct current power source voltage V00 supplied from the variable voltage power source 210 is inputted via the power source line 206 to drains of the output transistors Q201 and Q203. Each of sources of the output transistors Q202 and Q204 has a GND level via the power source line 207. Further, (i) a junction between a source of the output transistor Q201 and a drain of the output transistor Q202 and (ii) a junction between a source of the output transistor Q203 and a drain of the output transistor Q204 function as output terminals, and are respectively connected to a positive-phase output terminal P201 and a negative-phase output terminal P202 via the low pass filters 203 and 204. A load resistor P201 is provided between the output terminals P201 and P202. The low pass filter 203 is constituted of a coil L201 and a capacitor C201, and the low pass filter 204 is constituted of a coil L202 and a capacitor C202.

Meanwhile, a PWM signal which switches between a Vcc level and a GND level is inputted from a power source input terminal T00 to a variable voltage power source 210. When the potential Vcc/GND is smoothed by a low pass filter 211 constituting the variable voltage power source 210, a voltage corresponding to a duty of the PWM signal is outputted. The voltage is inputted to the drains of the output transistors Q201 and Q203 via the power source line 206 as the power source voltage V00. When an amplitude level of an outputted digital signal is varied by varying the power source voltage V00, and the digital signal is smoothed by the low pass filters 203 and 204, it is possible to vary a level of the reproduced analog audio signal, that is, it is possible to perform volume adjustment. The low pass filter 211 is constituted of a coil L203 and a capacitor C203.

Further, a direct current power source voltage V01, supplied to a power source input terminal T01, that has been outputted from a fixed-voltage power source (not shown), is inputted to the upper gate drive circuit 208. Likewise, a direct current power source voltage V02, supplied to a power source input terminal T02, that has been outputted from the fixed-voltage power source (not shown), is inputted to the lower gate drive circuit 209.

Recently, such a high-efficient amplifier has been required to consume less power.

However, the arrangements of FIG. 8 and FIG. 9 have the following problems in terms of the power consumption.

In the arrangement of FIG. 8, even when turning down the volume, a constant voltage is supplied as a power source voltage to the output full-bridge circuit 104 which performs switching amplification with respect to an output signal from the ΔΣ modulation circuit 102, so that it is general that the power consumption in this case is not different from power consumption in case of turning up the volume (this is well-known fact, so that there is no particular data). In order to reduce the power consumption, a power source voltage of the output full-bridge circuit 104 may be reduced. However, this raises the following problem: drop of the power source voltage causes the output level to drop, so that a maximum output (maximum volume) also drops.

In the arrangement of FIG. 9, a level of the power source voltage of the variable voltage power source 109 and an amplitude level (output level) of an output of the output full-bridge circuit 104 vary substantially in the same manner, so that the power consumption is not always kept at a level of the high volume as in the arrangement of FIG. 8. However, in the arrangement of FIG. 9, it is general that the variable voltage power source 109 is arranged as a servo circuit. Thus, a sufficient servo gain cannot be obtained in case of a low voltage, so that a voltage which has not been sufficiently servoed by the servo circuit is supplied to the switching amplification means. As a result, this raises the following deterioration of an audio performance: a distortion scale factor increases; S/N drops; and remaining noise increases. A data example of the distortion scale factor at this time is shown by a graph of FIG. 5. As shown by ♦ of FIG. 5, in a range where the output volume value is small, the distortion scale factor becomes larger as an output volume value becomes smaller.

Further, in the digital amplifier 201, when turning down the volume, the duty of the PWM signal inputted to the power source input terminal T00 is reduced as described above, so that a power level actually provided to a speaker, that is, a power level consumed in the output drive circuit 205 becomes smaller. However, power consumption in other circuits is the same as power consumption in the case where the volume is high. This is the same as in the case of FIG. 9. For example, the power consumption thereof is the same as the power consumption in the gate drive circuit 103 in the case of turning down the volume.

In view of the foregoing problems, the present invention was devised to reduce the power consumption of a digital amplifier in case of turning down the volume. Further, the present invention improves an audio performance of the digital amplifier.

DISCLOSURE OF INVENTION

The digital amplifier of the present invention, in which a driving circuit drives switching elements in response to an audio signal that has been converted into a 1-bit signal, and an amplitude of the audio signal is amplified by switching a power source voltage, comprising: variable power source voltage generating means for generating the power source voltage which is variable; and driving voltage variation means for varying a driving voltage by which the driving circuit drives the switching elements.

According to the foregoing arrangement, the variable power source voltage generating circuit can vary a power source voltage of the digital amplifier so as to correspond to variation of the output amplitude, and the driving voltage variation means accordingly vary a driving voltage of the switching element, such as a gate voltage of a MOSFET. That is, when the power source voltage becomes higher, also the driving voltage is made higher, and when the power source voltage becomes lower, also the driving voltage is made lower. In this manner, in the case of NMOSFET, an on-state gate voltage is always kept higher than the source voltage so that a difference therebetween corresponds to a predetermined voltage.

Thus, it is possible to minimize the driving voltage without influencing a switching operation of the switching element, so that it is possible to reduce the power consumption of the driving circuit when an amplitude of an output is small.

Further, the digital amplifier of the present invention is arranged so that: the variable power source voltage generating means includes a low pass filter for smoothing a pulse width modulation signal obtained by switching a predetermined direct current voltage in a duty variable manner, and the driving voltage variation means includes: a capacitor whose one terminal receives the pulse width modulation signal; a diode for inputting a predetermined constant voltage into an other terminal of the capacitor; and a low pass filter for smoothing an output from the other terminal of the capacitor, wherein a voltage obtained by adding the constant voltage to the power source voltage is supplied to the driving circuit as the driving voltage.

According to the foregoing arrangement, when a level of a switching output of a direct current power source is low, for example, when the level is a GND level, also a potential of one terminal of the capacitor has the GND level, and a potential of the other terminal of the capacitor is a constant voltage V1 passing through the diode, so that the capacitor is charged. On the other hand, when the level of the switching output of the direct current power source is high, for example, when the level is Vcc level, also a potential of one terminal of the capacitor has the Vcc level, and a potential of the other terminal of the capacitor is Vcc+V1, so that discharge is commenced. Then, the potentials V1 and Vcc+V1 are smoothed by the low pass filter, and the varied power source voltage outputted from the direct current power source is V0, this results in V0+V1. That is, the power source voltage V0 is a potential obtained by causing the low pass filter to smooth two potentials Vcc and GND, and varies in accordance with a duty.

Thus, it is possible to easily generate a driving voltage, to which a constant voltage V1 is continuously added, in accordance with variation of the power source voltage V0.

Another volume control device of the present invention, which controls an amplitude of an output signal outputted from a digital amplifier having amplification means for performing switching amplification with respect to an audio signal converted into a 1-bit signal, comprising: amplitude variation means for varying an amplitude of the audio signal, which has not been converted into the 1-bit signal, into an amplitude increased by a predetermined scale factor; a voltage variation means for varying a power source voltage supplied to the amplification means into a voltage having a specified voltage value; and setting control means for setting the scale factor to be constant when the amplitude is set to be between a maximum value and a predetermined intermediate value, and setting the voltage value to be a value corresponding to a specified input volume value, and setting the voltage value to be constant when the amplitude is set to be between the intermediate value and a minimum value, and setting the scale factor to be a value corresponding to the specified input volume value.

According to the foregoing arrangement, when an amplitude of the output signal is set to be between the maximum value and the intermediate value, a constant scale factor set by the setting control means and a voltage value corresponding to an input volume value are respectively provided to the amplitude variation means and the voltage variation means. Thus, an audio signal having a constant amplitude which corresponds to the scale factor is outputted from the amplitude variation means, thus outputted audio signal is converted into a 1-bit signal by a ΔΣ modulation circuit for example, and is then subjected to switching amplification by means of the amplification means. Here, the switching amplification is performed as follows: a plurality of switching elements are driven by a driving voltage generated in accordance with the 1-bit signal so as to switch and output a power source voltage, thereby outputting a signal obtained by amplifying an amplitude of the 1-bit signal. When performing the switching amplification, the power source voltage provided to the amplification means is outputted from the voltage variation means as a voltage value corresponding to an input volume value. Thus, an amplitude of an output signal from the amplification means is adjusted by the power source voltage. As a result, as the amplitude of the output signal is adjusted so as to approach from the maximum value to the intermediate value, the power source voltage drops, so that also the power consumption of the amplification means is accordingly reduced.

Meanwhile, when setting the amplitude of the output signal between the intermediate value and the minimum value, a constant voltage value set by the setting control means and a scale factor corresponding to an input volume value are respectively provided to the voltage variation means and the amplitude variation means. Thus, an audio signal having an amplitude which corresponds to the input volume value is outputted from the amplitude variation means, and is converted into a 1-bit signal, and is then subjected to the switching amplification by means of the amplification means. At this time, the power source voltage provided to the amplification means is outputted from the voltage variation means as a constant voltage value. Thus, an amplitude of the output signal from the amplification means is adjusted by the scale factor. As a result, even when the amplitude of the output signal is adjusted so as to approach from the intermediate value to the minimum value, the power source voltage does not vary. Thus, the voltage variation means constituted of a servo-system variable power source device stably carries out a servo operation, so that it is possible to stably output the power source voltage. A stable power source voltage is provided, so that the amplification means suppresses deterioration of an audio performance such as a distortion scale factor.

It is preferable to arrange the aforementioned volume control device so that: the setting control means includes storage means for storing the scale factor and the voltage value that correspond to the input volume value, and the setting control means, on the basis of the input volume value that has been specified, outputs the scale factor and the voltage value that correspond to the input volume value. Thus, it is possible to obtain the scale factor and the voltage value at the same time in accordance with a single input volume value, so that it is possible to easily obtain a desired combination of the scale factor and the voltage value in the foregoing two amplitude adjustment ranges. Thus, it is possible to easily control the volume in the foregoing two amplitude adjustment ranges.

It is preferable to arrange the volume control device so that: the setting control means sets the voltage value to be 0.1 times as large as a maximum value when the amplitude is set to be between the intermediate value and the minimum value. Thus, it is possible to suppress the power consumption of the amplification means so as to be approximately 0.1 times as large as the maximum value, and it is possible to suppress the deterioration of the audio performance without bringing about any practical disadvantage. Thus, it is possible to provide a volume control device having higher performance.

The digital amplifier of the present invention includes: any one of the volume control devices arranged in the foregoing manner; 1-bit conversion means for converting the audio signal into a 1-bit signal; and the amplification means. Thus, it is possible to provide a digital amplifier which consumes less power and has higher audio performance.

For a fuller understanding of the nature and advantages of the invention, reference should be made to the ensuing detailed description taken in conjunction with the accompanying drawings.

BEST MODE FOR CARRYING OUT THE INVENTION

The following Examples and Comparative Examples will detail the present invention, but the present invention is not limited to this.

EXAMPLE 1

Figure 1:
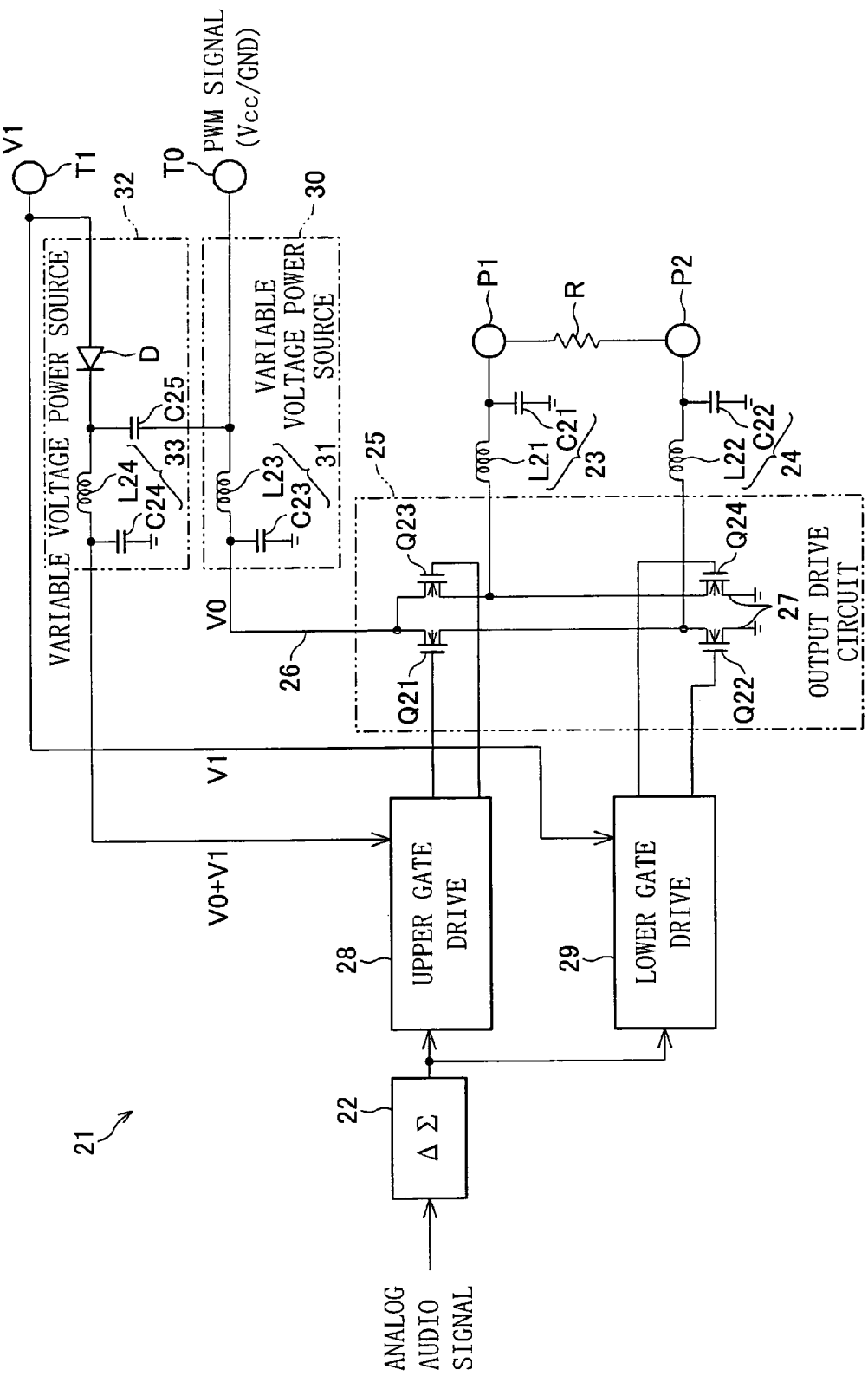
FIG. 1 is a block diagram showing an arrangement of a digital amplifier as an example of the present invention.
Figure 2:
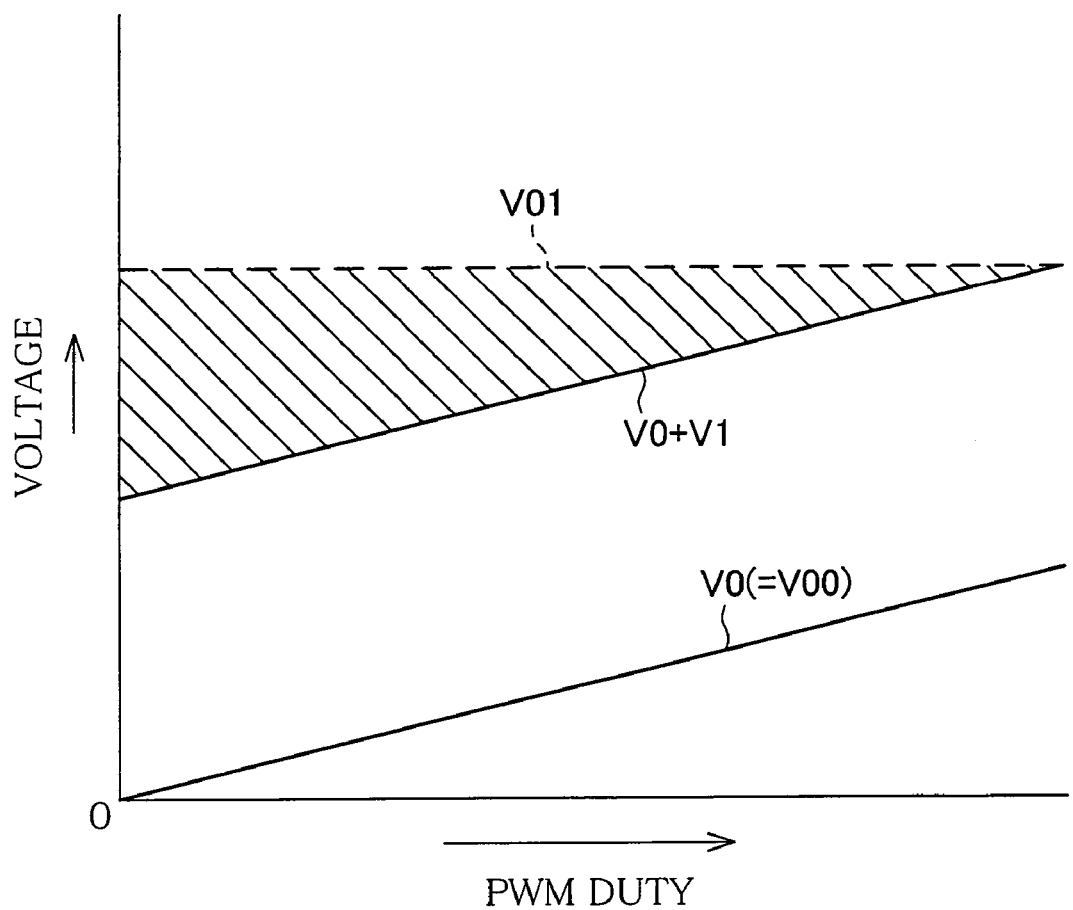
FIG. 2 is a graph showing a relationship between a conventional digital amplifier and the digital amplifier of FIG. 1 in terms of a power source voltage.

The following description will explain an example of the present invention with reference to FIG. 1 and FIG. 2.

FIG. 1 is a block diagram showing an arrangement of a digital amplifier 21 as the present example.

The digital amplifier 21 performs voltage amplification (amplitude conversion) after causing a $\Delta\Sigma$ block 22 to convert an analog audio signal into a 1-bit digital signal such as PDM and PWM, and causes low pass filters 23 and 24 to convert the 1-bit digital signal into an analog signal again, thereby performing the power amplification with high efficiency. Further, the power amplification is performed by causing (i) a series circuit of output transistors Q21 and Q22 each of which is constituted of NMOSFET intervening between a high-level power source line 26 and a low-level power source line 27 and (ii) a series circuit of output transistors Q23 and Q24 each of which is constituted of NMOSFET intervening between the high-level power source line 26 and the low-level power source line 27 to perform a push-pull operation in an output drive circuit 25.

The 1-bit signal from the $\Delta\Sigma$ block 22 is inputted to an upper gate drive circuit 28, and the output transistors Q21 and Q23 are driven by a positive component and a negative component that are generated here, and the other 1-bit signal is inputted to a lower gate drive circuit 29, and the output transistors Q22 and Q24 are driven by a positive component and a negative component that are generated here. By the gate drive circuits 28 and 29, a pair of the NMOSFETs Q21 and Q24, that are positioned diagonally with respect to each other, is driven at the same phase, and a pair of the output transistors Q22 and Q23 is driven at the same phase, and (i) a pair of the output transistors Q21 and Q24 and (ii) the pair of the output transistors Q22 and Q23 are driven at phases opposite to each other, thereby realizing the push-pull operation.

Each of the upper gate drive circuit 28 and the lower gate drive circuit 29 is constituted of a CMOS gate IC for example. The upper gate drive circuit 28 receives an output voltage from a variable voltage power source 30 described later as a power source voltage, and outputs a on-state gate voltage which is substantially equal to the power source voltage. The lower gate drive circuit 29 receives an output voltage from a variable voltage power source 32 described later as a power source voltage, and outputs an on-state gate voltage which is substantially equal to the power source voltage.

Further, a variable direct current power source voltage V0 that has been outputted from the variable voltage power source 30 is inputted to drains of the output transistors Q21 and Q23 via the power source line 26, and each of sources of the output transistors Q22 and Q24 has a GND level via the power source line 27. Moreover, (i) a junction of a source of the output transistor Q21 and a drain of the output transistor Q22 and (ii) a junction of a source of the output transistor Q23 and a drain of the output transistor Q24 function as output terminals, and are respectively connected to a positive-phase output terminal P1 and a negative-phase output terminal P2 via the low pass filters 23 and 24. Between the output terminals P1 and P2, a load resistor R is provided. The low pass filter 23 is constituted of a coil L21 and a capacitor C21, and the low pass filter 24 is constituted of a coil L22 and a capacitor C22.

Meanwhile, the variable voltage power source 30 which functions as variable power source voltage generating means receives a PWM signal, which switches between a Vcc level and a GND level, from a power source input terminal T0, and when the potential Vcc/GND is smoothed by the low pass filter 31 constituting the variable voltage power source 30, a voltage corresponding to a duty ratio of the PWM signal is outputted, and is then inputted to the drains of the output transistors Q21 and Q23 via the power source line 26 as a power source voltage V0. When the power source voltage is made to vary, an amplitude level of an outputted digital signal varies, and is smoothed by the low pass filters 23 and 24. When the signal is smoothed, it is possible to adjust variation of a level of a reproduced analog audio signal, that is, it is possible to adjust the volume thereof. This means that the PWM signal functions as a volume adjustment signal. The low pass filter 31 is constituted of a coil L23 and a capacitor C23.

The foregoing arrangement is the same as the arrangement of the conventional digital amplifier 201. However, in the digital amplifier 21 of the present invention, it is noteworthy that: a direct current power source voltage V1 that is supplied from a fixed-voltage power source (not shown) to the power source input terminal T1 is directly inputted to the lower gate drive circuit 29, and a voltage obtained by adding the power source voltage V1 to the power source voltage V0 is generated by the variable voltage power source 32 which functions as driving voltage variation means, and is inputted to the upper gate drive circuit 28. Thus, as in the variable voltage power source 30, the variable voltage power source 32 includes not only a low pass filter 33 constituted of a coil L24 and a capacitor C24 but also a capacitor C25 and a diode D.

The PWM signal, switching between the Vcc level and the GND level, that is inputted to the power source input terminal T0, is inputted to one terminal of the capacitor C25, and a constant power source voltage V1 from the power source input terminal T1 is inputted to the other terminal via the diode D. An output from the other terminal of the capacitor C25 is smoothed by the low pass filter 33, and is inputted to the upper gate drive circuit 28.

Thus, when the PWM signal has a GND level, also a potential of one terminal of the capacitor C25 has the GND level, and a potential of the other terminal of the capacitor C25 corresponds to the power source voltage V1 inputted via the diode D so as to charge the capacitor C25. In contrast, when the PWM signal has the Vcc level, also a potential of one terminal of the capacitor C25 has the Vcc level, and a potential of the other terminal of the capacitor C25 corresponds to Vcc+V1, so that discharge is commenced. Further, when the potential V1 and the potential Vcc+V1 are smoothed by the low pass filter 33, this raises such condition that: V0+V1. That is, the power source voltage V0 is a potential obtained by causing the low pass filter 31 to smooth two potentials Vcc and GND, and varies depending on the duty. In this manner, it is possible to easily generate a driving voltage, in which a constant voltage V1 is added, corresponding to variation of the power source voltage V0.

Further, when the power source voltage is varied by using, for example, a CMOS gate IC as the upper gate drive circuit 28, an output voltage accordingly varies, so that also the power consumption accordingly varies.

In the digital amplifier 21 arranged as described above, since a source potential is a GND potential, a gate-source voltage VGS1 required in turning ON the output transistors Q22 and Q24 that are positioned lower is a voltage defined in specifications of MOSFET, for example, 2.5V. On the other hand, since a source potential is the power source voltage V0, a gate-source voltage VGS2 required in turning ON the output transistor Q21 and Q23 that are positioned upper is V0+2.5V.

Thus, as shown in FIG. 2 when the power source voltage V0 is high, a voltage by which the upper gate drive circuit 28 drives gates of the output transistors Q21 and Q23 is made higher, and when the power source voltage V0 is low, the voltage by which the upper gate drive circuit 28 drives the gates of the output transistors Q21 and Q23 is made lower. In this manner, it is possible to continuously keep the on-state gate voltage so high as to correspond to a predetermined voltage V1 which is constant. Thus, it is possible to minimize the voltage by which the upper gate drive circuit 28 drives the gates of the output transistors Q21 and Q23 without influencing the switching operation of the output transistors Q21 and Q23 when V1=2.5V, so that it is possible to reduce the power consumption of the upper gate drive circuit 28 in the case of turning down the volume (it is possible to reduce the power consumption so that its decrement corresponds to a voltage difference indicated by a shaded area in FIG. 5).

Figure 5:
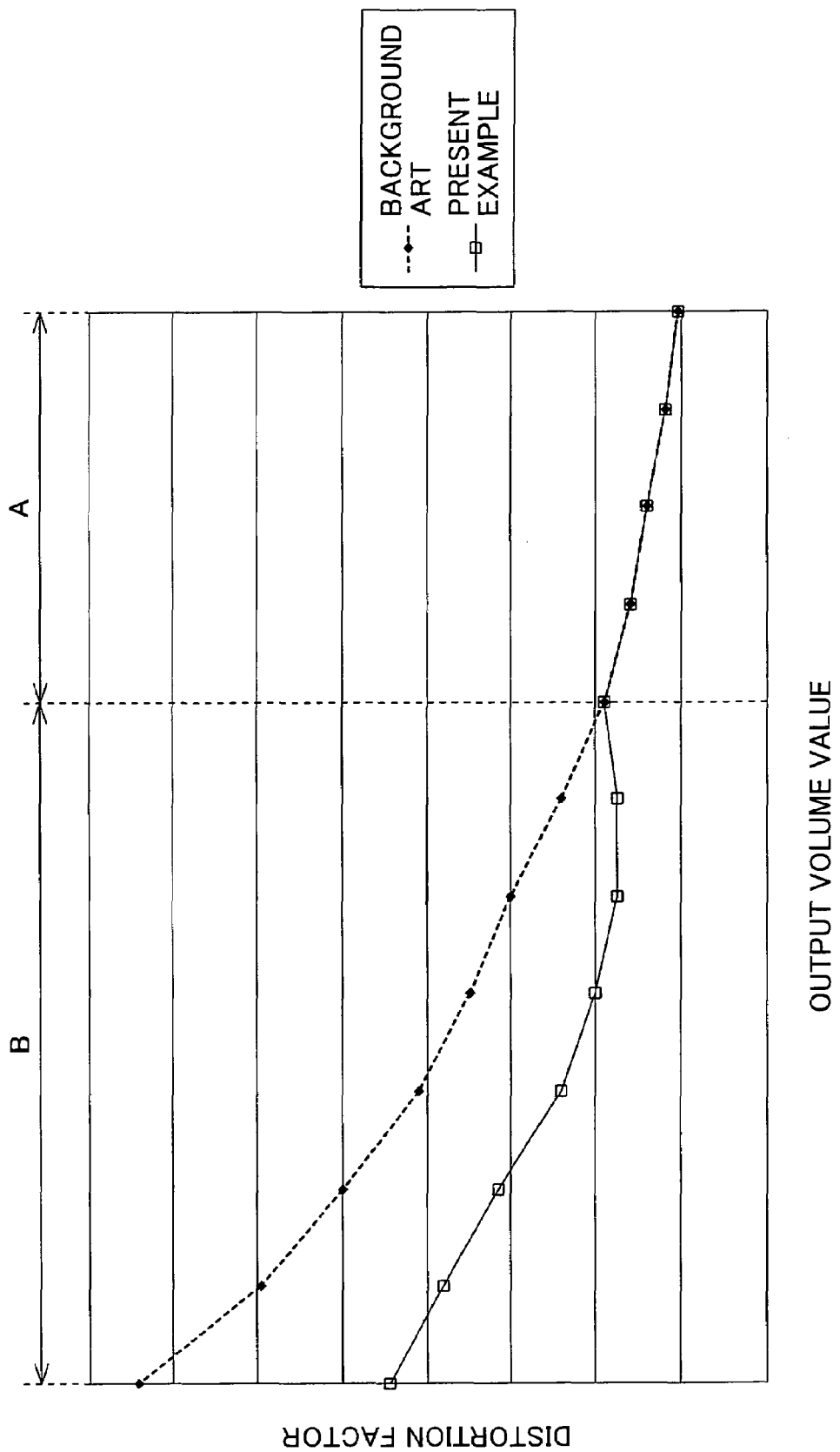
FIG. 5 is a graph showing how distortion scale factors vary with respect to output volume values in controlling the volume of the digital amplifier of FIG. 3 and in controlling the volume of the conventional digital amplifier.

On the other hand, in the conventional digital amplifier 51, as shown in FIG. 5, a voltage v1 which is so sufficiently high as to continuously turn ON the output transistors Q21 and Q23 is supplied to the gates of the output transistors Q21 and Q23 regardless of the power source voltage V0 (=V50). Meanwhile, also in turning down the volume, the same power consumption is required as in turning up the volume since the current consumption is in proportion to the voltage.

Note that, the digital amplifier 21 of the present invention is not limited to the foregoing arrangement, having an analog/digital converter, in which an analog signal is subjected to the amplitude amplification after being converted into the PDM signal or the PWM signal, but the digital amplifier 21 may be arranged so that the digital signal is directly inputted from the outside. Further, it may be so arranged that: a digital/analog converter such as the low pass filters 23 and 24 for smoothing the output digital signal so as to restore thus smoothed signal into an analog signal is externally provided.

Further, as to the output drive circuit 25, the case where its lower side is grounded has been described as an arrangement of an H bridge having four NMOSFETs. However, it may be so arranged that: its upper side is grounded, and its lower side is used as a negative power source. Alternatively, it may be so arranged as a half bridge having two NMOSFETs.

As described above, the digital amplifier 21 of the present example is arranged as follows: in response to an input digital signal, a driving circuit (the upper gate drive circuit 28 and the lower gate drive circuit 29) drives switching elements (the output transistors Q21 to Q24), and a power source voltage from a direct current power source is switched so as to perform amplitude amplification, wherein the direct current power source includes a variable voltage power source 32, arranged so that its output power source voltage is variable, which varies a driving voltage, by which the driving circuit drives the switching elements, in accordance with variation of the power source voltage of the direct current power source.

According to the arrangement, the power source voltage of the digital amplifier is made variable so as to vary the output amplitude, and the variable voltage power source 32 accordingly varies the driving voltage of the switching elements, such as the gate voltage of the MOSFET. That is, when the power source voltage is high for example, the driving voltage is also made high, and when the power source voltage is low, the driving voltage is also made low. In this manner, in the case of the MOSFET for example, the on-state power source voltage is always kept so higher than the source voltage as to correspond to a predetermined voltage.

Thus, it is possible to minimize the driving voltage without influencing the switching operation of the switching element, so that it is possible to reduce the power consumption of the driving circuit when the output amplitude is small.

Further, in the digital amplifier 21, the direct current power source switches a predetermined direct current voltage in a duty variable manner, and causes the low pass filter to smooth its output, so that a variable power source voltage to the switching element is generated, and the variable voltage power source 32 includes: a capacitor C25 whose one terminal receives a voltage switched by the direct current power source; a diode D for inputting a predetermined constant voltage to the other terminal of the capacitor C25; and a low pass filter 24 for smoothing an output from the other terminal of the capacitor C25, wherein a voltage is generated by adding the constant voltage to a power source voltage supplied to the switching element, so as to supply thus generated voltage to the driving circuit as the driving voltage.

According to the foregoing arrangement, when a level of the switching output of the direct current power source is low, for example, when the switching output has a GND level, also a potential of one terminal of the capacitor C25 has the GND level, and a potential of the other terminal of the capacitor C25 corresponds to a constant voltage V1 inputted via the diode D, so that the capacitor C25 is charged. On the other hand, when a level of the switching output of the direct current power source is high, for example, when the switching output has a Vcc level, also the potential of one terminal of the capacitor C25 has the Vcc level, and the potential of the other terminal of the capacitor C25 is Vcc+V1, so that discharge is commenced. Further, when the potentials V1 and Vcc+V1 are smoothed by the low pass filter, this results in V0+V1 under such condition that a varied power source voltage which has been outputted from the direct current power source is V0. That is, the power source voltage V0 is a potential obtained by causing the low pass filter to smooth two potentials Vcc and GND, and varies depending on the duty.

Thus, it is possible to easily generate the driving voltage in which the constant voltage V1 is continuously added in accordance with variation of the power source voltage V0.

EXAMPLE 2

The following description will explain another example of the present invention with reference to FIG. 3 to FIG. 6.

Figure 3:
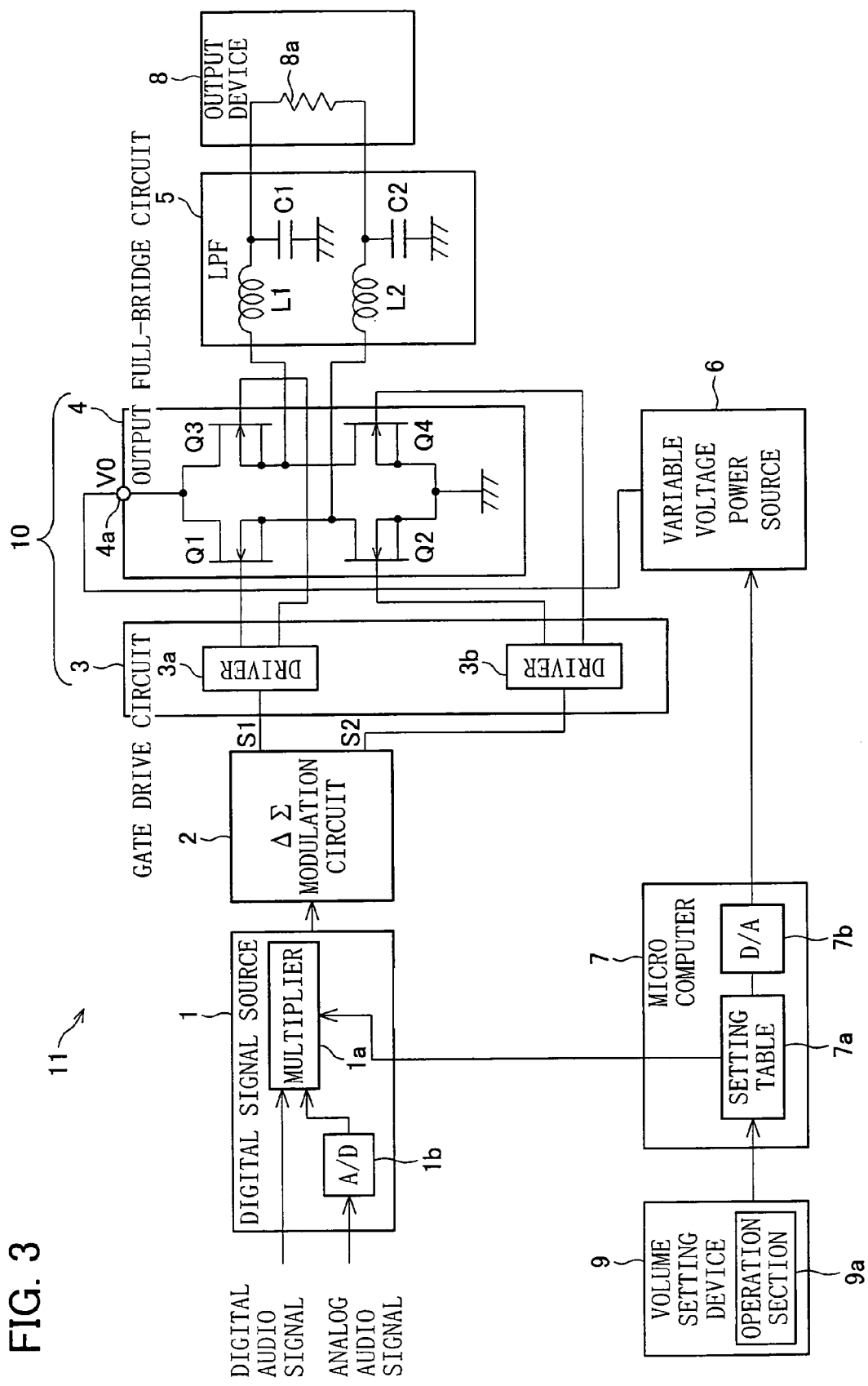
FIG. 3 is a block diagram showing an arrangement of a digital amplifier as another example of the present invention.

FIG. 3 is a block diagram showing an arrangement of a digital amplifier 11 of the present example.

The digital amplifier 11 which is a 1-bit digital amplifier includes a digital signal source 1, a ΔΣ modulation circuit 2, a gate drive circuit 3, an output full-bridge circuit 4, a low pass filter (LPF in FIG. 3) 5, a variable voltage power source 6, and a micro computer 7.

The digital signal source 1 is a portion for receiving a digital and/or an analog audio signal, and has an amplitude adjustment function. In order to adjust an amplitude of an audio signal by performing a digital process on the basis of amplitude adjustment data outputted from the micro computer 7 as an amplitude adjustment function, the digital signal source 1 has a multiplier 11a as amplitude variation means for multiplying a multiplication coefficient (scale factor) set in the digital signal, that is, amplitude adjustment data. Further, the digital signal source 1 also has an A/D converter (A/D in FIG. 3) 1b for converting an analog audio signal into a digital audio signal. Thus, the digital signal source 1 outputs the digital audio signal from the multiplier 1a.

The ΔΣ modulation circuit 2 which functions as 1-bit converting means is a circuit for performing ΔΣ modulation with respect to the audio signal that has been subjected to the amplitude adjustment by means of the digital signal source 1 so as to output a 1-bit digital signal (a PDM signal or a PWM signal). Further, a ΔΣ block 101 generates two positive-phase signals: 1-bit digital signals S1 and S2 in accordance with a binary signal that has been generated, so as to respectively output thus generated 1-bit signals S1 and S2.

The gate drive circuit 3 generates a gate signal for driving output transistors Q1 to Q4 of the output full-bridge circuit 4 in accordance with the 1-bit digital signals S1 and S2, and has drivers 3a and 3b. The driver 3a outputs a gate signal for turning ON/OFF the output transistor Q1 and a gate signal for driving the output transistor Q3 at a phase opposite to a phase of the output transistor Q1 in accordance with the 1-bit digital signal S1. Meanwhile, the driver 3b outputs a gate signal for turning ON/OFF the output transistor Q2 at a phase opposite to the phase of the output transistor Q1 and outputs a gate signal for driving the output transistor Q4 at a phase opposite to the phase of the output transistor Q3 in accordance with the 1-bit digital signal S2. In order to output the gate signals interrelated with each other in accordance with the 1-bit digital signals S1 and S2, each of the drivers 3a and 3b is constituted of a logic circuit.

The output full-bridge circuit 4 has the output transistors Q1 to Q4 each of which is constituted of an N-channel MOS transistor (NMOSFET). Drains of the output transistors Q1 and Q3 are connected to a power source terminal 4a, and sources of the output transistors Q2 and Q4 are grounded. A variable power source voltage V0 which has been generated in the variable power source voltage 6 is applied to the power source terminal 4a. A source of the output transistor Q1 and a drain of the output transistor Q2 are connected to each other, and a junction thereof functions as one output end (negative-phase output), and a source of the output transistor Q3 and a drain of the output transistor Q4 are connected to each other, and a junction thereof functions as the other output end (positive-phase output).

Further, the gate signal from the driver 3a is inputted to gates of the output transistors Q1 and Q3, and the gate signal from the driver 3b is inputted to gates of the output transistors Q2 and Q4. Thus, the output transistors Q1 and Q4 are driven at the same phase, and the output transistors Q2 and Q3 are driven at the same phase, and (i) the output transistors Q1 and Q4 and (ii) the output transistors Q2 and Q3 are driven at phases opposite to each other, so that the output full-bridge circuit 4 performs a push-pull operation, thereby outputting positive-phase and negative-phase pulse signals whose amplitude has been amplified to V0.

In the digital amplifier 11, the switching amplification is performed as follows: the output transistors Q1 to Q4 (switching elements) of the output full-bridge circuit 4 are driven in accordance with the gate signals (driving signals) generated in the gate drive circuit 3 on the basis of the 1-bit digital signals S1 and S2 so as to switch and output the power source voltage V0, thereby outputting signals, obtained by amplifying amplitudes of the 1-bit digital signals S1 and S2. That is, the gate drive circuit 3 and the output full-bridge circuit 4 constitute a switching amplification section (amplification means) in the digital amplifier 11.

The low pass filter 5 has coils L1 and L2 and capacitors C1 and C2. The positive-phase pulse signal is inputted to an input end of the coil L1, and the capacitor C1 is provided between an output end of the coil L1 and a ground. The negative-phase pulse signal is inputted to an input end of the coil L2, and a capacitor C2 is provided between an output end of the coil L2 and a ground. The positive-phase pulse signal is converted into an analog audio signal by passing through a low pass filter constituted of the coil L1 and the capacitor C1, and the negative-phase pulse signal is converted into an analog audio signal by passing through a low pass filter constituted of the coil L2 and the capacitor C2.

The output device 8 is an electric audio conversion device, such as a head phone and a speaker, connected to the digital amplifier 11, and has a load 8a which converts a positive-phase audio signal and a negative-phase audio signal that are outputted from the low pass filter 5 into sounds. The positive-phase audio signal is inputted to one end of the load 8a, and the negative-phase audio signal is inputted to the other end of the load 8a.

The variable voltage power source 6 which functions as voltage variation means is a power source circuit for generating a variable power source voltage V0 applied to the output full-bridge circuit 4. The variable voltage power source 6 has a servo function as in a general constant voltage power source which compares an output voltage with a reference voltage after feed-backing the output voltage so as to control the output voltage so that the output voltage is not different from the reference voltage. However, instead of including a reference voltage source for generating the reference voltage, the variable voltage power source 6 uses an analog power source control voltage, outputted from the micro computer 7, as the reference voltage.

Note that, the variable voltage power source 6 outputs a single power source voltage V0, but when the output full-bridge circuit 4 is arranged so as to require two power source voltages, i.e., a positive power source voltage and a negative power source voltage, the variable voltage power source 6 accordingly outputs two power source voltages.

A digital volume setting value (input volume value) is inputted from an external volume setting device 9 to the micro computer 7. The volume setting device 9 includes an operation section 9a, provided with an up key and a down key for example, in order that the user sets the volume. The volume setting device 9 varies the volume setting value in stages (at each predetermined volume step). For example, in case of setting the volume value by means of the up key and the down key, the volume is turned up by one step when giving single push to the up key, and the volume is turned down by one step when giving single push to the down key.

Note that, as long as it is possible to turn up/down the volume for each volume step, it may be arranged without using the up and down keys, and it may be so arranged that the operation section 9a is provided separately from the volume setting device 9 like a remote controller.

The micro computer 7 outputs amplitude adjustment data to the digital signal source 1, and outputs a power source control voltage to the variable voltage power source 6. The micro computer 7 which functions as setting control means includes a setting table 7a (storage means) for storing (i) amplitude adjustment data corresponding to each volume setting value and (ii) power source control voltage data (voltage value) with them interrelated to each other for each volume setting value. From the setting table 7a, the micro computer 7 reads out (i) the amplitude adjustment data and (ii) the power source control voltage data that correspond to inputted volume setting value. Further, the micro computer 7 has a D/A converter (D/A in FIG. 6) for converting the power source control voltage data into an analog power source control voltage.

A value of the power source control voltage data stored in the setting table 7a is set in such a manner that: 100%, 90%, . . . , 10% with respect to the power source voltage of the micro computer 7 for example. Further, the setting table 7a stores, as the amplitude adjustment data, a multiplication coefficient provided to the multiplier 1a of the digital signal source 1 in such a manner that: 1, 0.9, . . . , 0.1.

Here, the following description explains how the amplitude adjustment data and the power source voltage data are set in the setting table 7a.

When an output volume value (corresponding to an amplitude of an output signal from a switching amplification section 10) outputted from the output device 8 is between a maximum volume value Volmax (corresponding to a maximum value of the amplitude) and an intermediate volume value Volmid (corresponding to an intermediate value of the amplitude), the amplitude adjustment data is set to have a constant value, and the power source voltage data is set to vary for each volume step. In this case, the amplitude adjustment data is set to have a value which corresponds to 100% of the amplitude value of the digital audio signal inputted to the multiplier 1a in the digital signal source 1, that is, the amplitude adjustment data is set to be "1".

Meanwhile, when the output volume value is between the intermediate volume value Volmid and a minimum volume value Volmin (corresponding to a minimum value of the amplitude), the power source control voltage data is set to have a constant value, and the amplitude adjustment data is set to vary for each volume step. In this case, the power source control voltage data is set so that the power source voltage V0 has a predetermined value lower than the maximum value (for example, 0.1 times the maximum power source voltage when it has a lowest value).

Here, the following description explain a basic operation of the digital amplifier 11 arranged in the foregoing manner.

As to a digital audio signal, a multiplication coefficient (amplitude adjustment data) from the micro computer 7 is multiplied by the multiplier 1a of the digital signal source 1, thereby adjusting an amplitude of the digital audio signal as required. An analog audio signal is converted into a digital signal by the A/D converter 1b. Thereafter, as in the digital audio signal, the multiplication coefficient is multiplied by the multiplier 1a of the digital signal source 1, thereby adjusting an amplitude of the audio signal as required. The digital signal outputted from the digital signal source 1 is converted into 1-bit digital signals S1 and S2 (positive-phase components) by the ΔΣ modulation circuit 2.

The 1-bit digital signals S1 and S2 are respectively inputted to the drivers 3a and 3b of the gate drive circuit 3.

The driver 3a outputs gate signals, having phases opposite to each other, which have been generated in accordance with the 1-bit digital signal S1, to the output transistors Q1 and Q3. The driver 3b outputs gate signals, having phases opposite to each other, which have been generated in accordance with the 1-bit digital signal S2, to the output transistors Q2 and Q4. At this time, the output transistors Q1 and Q4 are driven at the same phase, and the output transistors Q2 and Q3 are driven at the same phase, and (i) the output transistors Q1 and Q4 and (ii) the output transistors Q2 and Q3 are driven at phases opposite to each other. Thus, a positive-phase pulse signal and a negative-phase pulse signal that have been amplified are outputted from the output full-bridge circuit 4.

Note that, as long as the output transistors Q1 to Q4 are driven with them interrelated to each other as described above, how the drivers 3a and 3b relate to the output transistors Q1 to Q4 is not limited to the arrangement shown in FIG. 3.

Further, the positive-phase and negative phase pulse signals are converted into analog signals by the low pass filter 5, and the analog signals are converted into sounds by the output device 8 so as to be outputted.

Next, the following description explains how the volume is controlled in the digital amplifier 11 which operates as described above.

First, the user operates the operation section 9a of the volume setting device 9, so that a volume setting value is set in the volume setting device 9. The micro computer 7 differently controls the volume depending on how large the volume setting value is.

When an output volume value corresponding to the volume setting value is between a maximum volume value Volmax and an intermediate volume value Volmid (volume range A), (i) amplitude adjustment data whose value is constant and (ii) power source control voltage data whose value corresponds to the volume setting value are read out from the setting table 7a. The amplitude adjustment data is provided to the multiplier 1a of the digital signal source 1 as a multiplication coefficient. Meanwhile, the power source control voltage data is converted into an analog power source control voltage by the A/D converter 7b so as to be provided to the variable voltage power source 6.

Thus, the multiplier 1a multiplies the digital signal inputted to the digital signal source 1 by the foregoing multiplication coefficient ("1"), and the digital signal is outputted with its input amplitude kept. Further, the variable voltage power source 6 outputs the power source voltage V0 controlled so as to be the foregoing power source control voltage. The output full-bridge circuit 4 performs the amplitude amplification so that the peak value is V0, so that a pulse signal that has been amplified so as to be the power source voltage V0 is outputted. Thus, the output device 8 outputs voices whose volume corresponds to the power source voltage V0.

Figure 4:
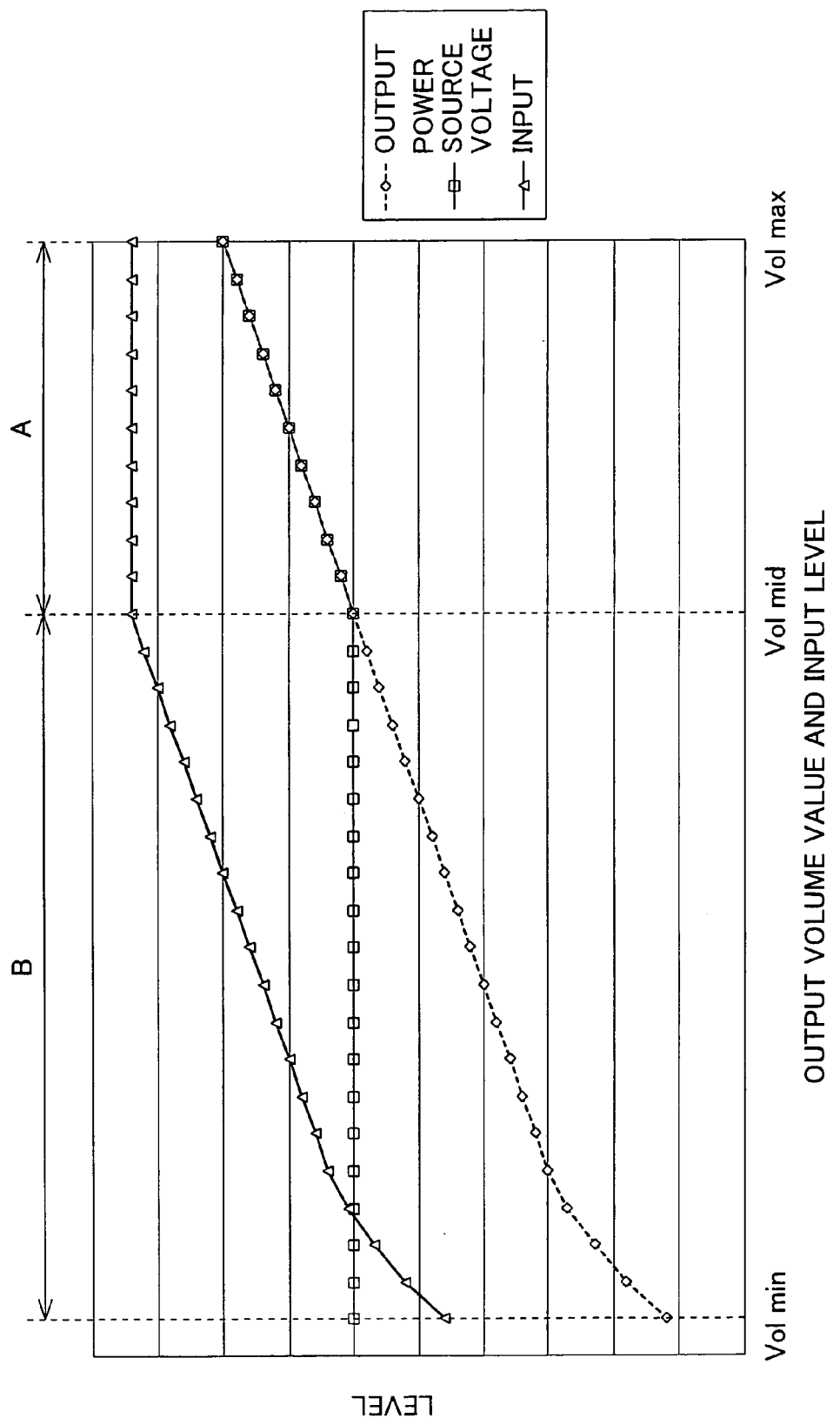
FIG. 4 is a graph showing a control property for controlling volume of the digital amplifier of FIG. 3.

As shown in FIG. 4, in the volume range A, an input level shown by Δ of FIG. 4 (a level of the digital signal inputted from the digital signal source 1 to the ΔΣ modulation circuit 2) is constant, and the power source voltage V0 shown by □ of FIG. 4 is variable, so that a level of an output from the output full-bridge circuit 4 varies for each volume step substantially in the same manner as in the power source voltage V0, as shown by ◇ of FIG. 4. That is, in the volume range A, the output volume value is determined (adjusted) on the basis of a value of the power source voltage V0.

Thus, as the adjustment is performed so that the output volume value approaches from the maximum volume value Volmax to the intermediate volume value Volmid, the power source voltage V0 drops, so that the power consumption of the output full-bridge circuit 4 accordingly drops.

When the output volume value corresponding to the volume setting value is between the intermediate volume value Volmid and a minimum volume value Volmin (volume range B), (i) power source control voltage data whose value is constant and (ii) amplitude adjustment data whose value corresponds to the volume setting value are read out from the setting table 7a. The amplitude adjustment data is provided to the multiplier 1a of the digital signal source 1 as a multiplication coefficient. Meanwhile, the power source control voltage data whose value is constant is converted into an analog power source control voltage by the D/A converter 7b so as to be provided to the variable voltage power source 6.

Thus, the multiplier 1a multiplies the inputted digital audio signal by a multiplication coefficient corresponding to the output volume value, thereby performing the amplitude adjustment. Further, the variable voltage power source 6 outputs the power source voltage V0, having a constant value, which is controlled so as to be the foregoing power source control voltage. The output full-bridge circuit 4 outputs a pulse signal amplified so as not to exceed the power source voltage V0 having a constant value. Thus, the output device 8 outputs voices whose volume corresponds to the amplitude level adjusted by the multiplier 1a.

As shown in FIG. 4, in the volume range B, an input level shown by Δ of FIG. 4 is constant, and the power source voltage V0 shown by □ of FIG. 4 is variable, so that a level of an output from the output full-bridge circuit 4 varies for each volume step substantially in the same manner as in the input level, as shown by ◇ of FIG. 4. That is, in the volume range B, the output volume value is determined (adjusted) on the basis of a value of the multiplication coefficient.

Further, in the volume range B, the power source voltage data is set so that the power source voltage V0 has a predetermined value lower than the maximum value. Thus, even when the output volume value is adjusted so as to approach from the intermediate volume value Volmid to the minimum volume value Volmin, the power consumption does not vary. Furthermore, in the volume range B, the power source voltage V0 to the output full-bridge circuit 4 is fixed to a predetermined level, so that a servo gain is obtained by the variable voltage power source 6 as in the low voltage output, thereby stabilizing a servo operation. As a result, it is possible to stably output the power source voltage V0. Thus, it is possible to improve an audio performance such as a distortion scale factor, S/N, and remaining noises. Particularly, it is possible to suppress the deterioration of the distortion scale factor of the output full-bridge circuit 4 unlike an arrangement of a conventional technique in which the power source voltage is varied in the whole volume range.

According to the arrangement of the conventional technique, as shown by ♦ of FIG. 5, the distortion scale factor varies in the volume range B substantially at the same change rate as in the volume range A, and deteriorates with drop of the output volume value. On the other hand, in the arrangement of the present example, as shown by □ of FIG. 5, the distortion scale factor largely drops in the volume range B compared with the distortion scale factor of the conventional technique.

Further, a lower limit of a predetermined level to which the power source voltage V0 is fixed is set to 0.1 times the maximum power source voltage as described above, so that it is possible to keep the power consumption so low as 0.1 times the maximum power consumption in the output full-bridge circuit 4, and it is possible to suppress the deterioration of the audio performance without bringing about any practical trouble. When the lower limit is further dropped, it is possible to further reduce the power consumption, but this so deteriorates the audio performance that a practical trouble occurs (for example, the sound quality is deteriorated), so that this setting is not preferable.

As described above, in the digital amplifier 11, the power source voltage V0 of the output full-bridge circuit 4 is made variable while fixing an amplitude of an input digital signal, inputted from the digital signal source 1 to the ΔΣ modulation circuit 2, to a range of a larger output volume value (volume range A), and the micro computer 7 performs the volume control so as to make an amplitude of the input digital signal variable while fixing the power source voltage V0 to a range of a smaller output volume value (volume range B). Thus, in the range of a larger output volume value, it is possible to suppress the power consumption of the output full-bridge circuit 4, and in the range of a lower output volume value, it is possible to suppress the deterioration of the audio performance.

Further, the micro computer 7 includes the setting table 7a for storing (i) amplitude adjustment data respectively corresponding to volume setting values from the volume setting device 9 and (ii) power source control voltage data with them interrelated to each other, and (a) the amplitude adjustment data corresponding to the inputted volume setting data and (b) the power source control voltage data are read out from the setting table 7a. Thus, it is possible to simultaneously obtain different kinds of data in accordance with a single volume setting value, so that it is possible to easily obtain a desired combination of the amplitude adjustment data and the power source control voltage data in the two volume ranges. Therefore, it is possible to easily perform the volume control in the aforementioned two volume ranges.

Note that, the intermediate volume value Volmid is arbitrarily set, in accordance with a performance of a required 1-bit digital amplifier, depending on whether or not to prioritize the reduction of the power consumption, or whether or not to prioritize suppression of the deterioration of the audio performance, or whether or not to counterbalance the reduction of the power consumption and the suppression of the deterioration of the audio performance.

Here, a modification example of the present example is described as follows with reference to FIG. 6.

Figure 6:
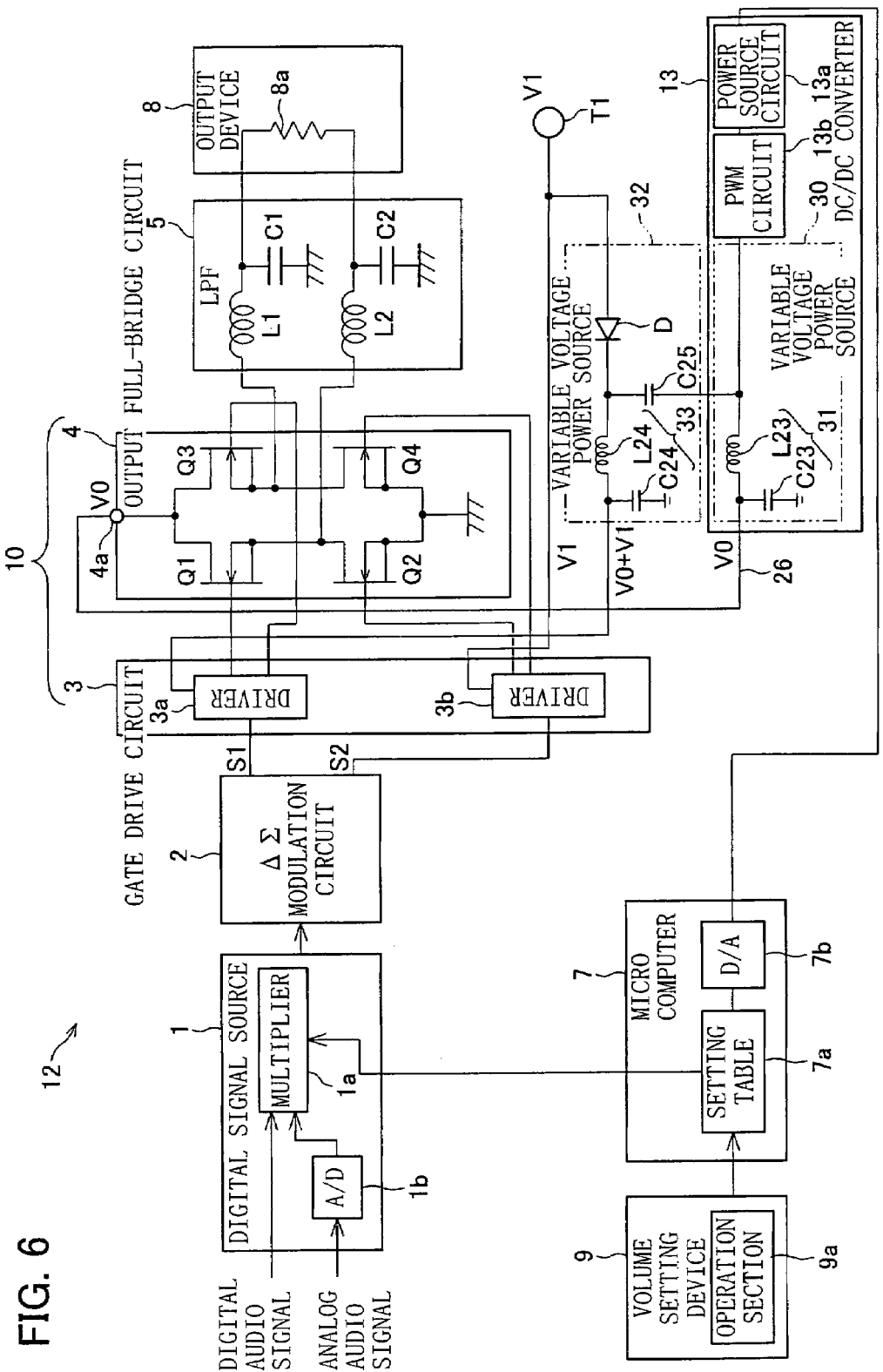
FIG. 6 is a block diagram showing how the digital amplifier of FIG. 3 is arranged as a modification example.

As shown in FIG. 6, the digital amplifier 12 is arranged in the same manner as in the digital amplifier 11 except for the variable voltage power source 6, and includes a DC/DC converter 13 and a variable voltage power source 32 provided in the aforementioned digital amplifier 1 of Example 1, instead of the variable voltage power source 6.

The DC/DC converter 13 is a voltage conversion circuit for converting the power source control voltage, outputted from the D/A converter 7b of the micro computer 7, into the power source voltage V0. The DC/DC converter 13 includes a power source circuit 3a, a PWM circuit 13b, and a variable voltage power source 30 provided in the aforementioned digital amplifier 21 of Example 1.

The power source circuit 13a is a circuit similar to the aforementioned variable voltage power source 6, and outputs the power source voltage V0 controlled in accordance with the power source control voltage. The PWM circuit 13b is constituted of a general PWM comparator for generating a PWM signal for example, and compares (i) a triangular wave signal, supplied from an oscillator provided in the PWM circuit 13b or from the outside, whose cycle is constant and whose amplitude is constant, with (ii) the power source voltage V0, so as to output a pulse signal having a duty ratio which is in proportion to a level of the power source voltage V0.

The variable voltage power source 30 demodulates the power source voltage V0 whose level is in proportion to the duty ratio of the PWM signal by causing a low pass filter 31 to smooth the PWM signal outputted from the PWM circuit 13b. Further, the variable power source voltage 30 is connected to the variable voltage power source 32 as in the variable voltage power source 30 in the digital amplifier 21 of Example 1.

The power source voltage V0 outputted from the variable voltage power source 30 is provided to a power source terminal 4a of the output full-bridge circuit 4. A direct current power source voltage V1 is not only inputted to the variable voltage power source 32 but also provided to a driver 3b of the gate drive circuit 3 as a power source voltage without being subjected to any modification. Further, a voltage of V0+V1 outputted from the variable voltage power source 32 is provided to a driver 3a of the gate drive circuit 3 as a power source voltage.

As in the digital amplifier 11 of FIG. 3, the digital amplifier 12 arranged in the foregoing manner can suppress the power consumption of the output full-bridge circuit 4 in a range of a larger output volume value, and can suppress the deterioration of the audio performance in a range of a smaller output volume value. Further, as in the digital amplifier 21, the digital amplifier 12 increases a gate driving voltage of the output transistors Q1 and Q3, that are driven by the driver 3a, when the power source voltage V0 is high, and decreases the gate driving voltage when the power source voltage V0 is low, so that it is possible to keep an on-state gate voltage higher than a source voltage so that a difference therebetween corresponds to a predetermined constant voltage V1. Thus, it is possible to reduce the power consumption of the driver 3a in turning down the volume by minimizing the gate driving voltage of the output transistors Q1 and Q3 without influencing the switching operation of the output transistors Q1 and Q3. Therefore, according to the digital amplifier 12, it is possible to further reduce the power consumption in turning down the volume compared with the digital amplifier 11.

EXAMPLE 3

Figure 7:
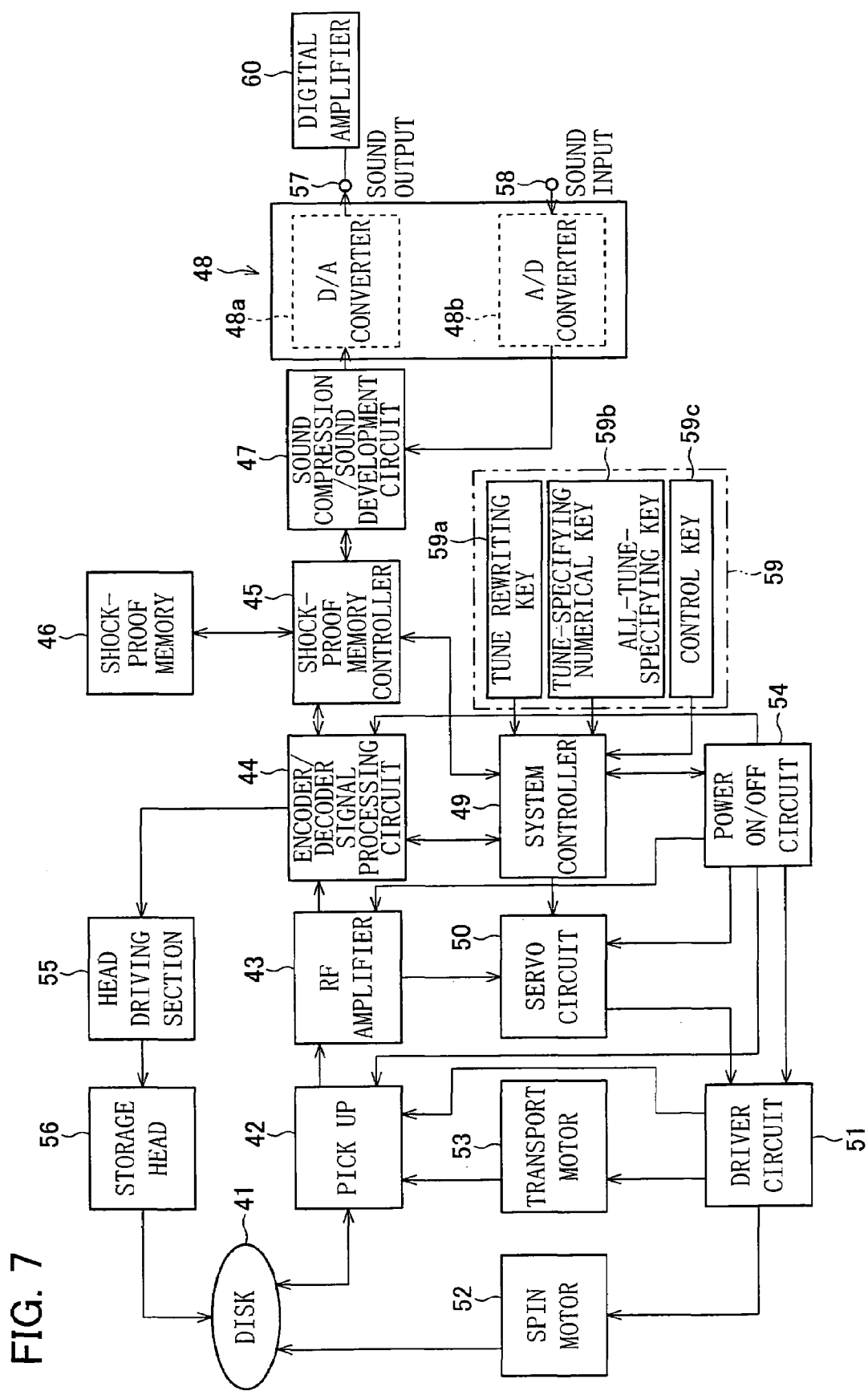
FIG. 7 is a block diagram showing a digital signal recording/reproducing device as a still another example of the present invention.
Figure 8:
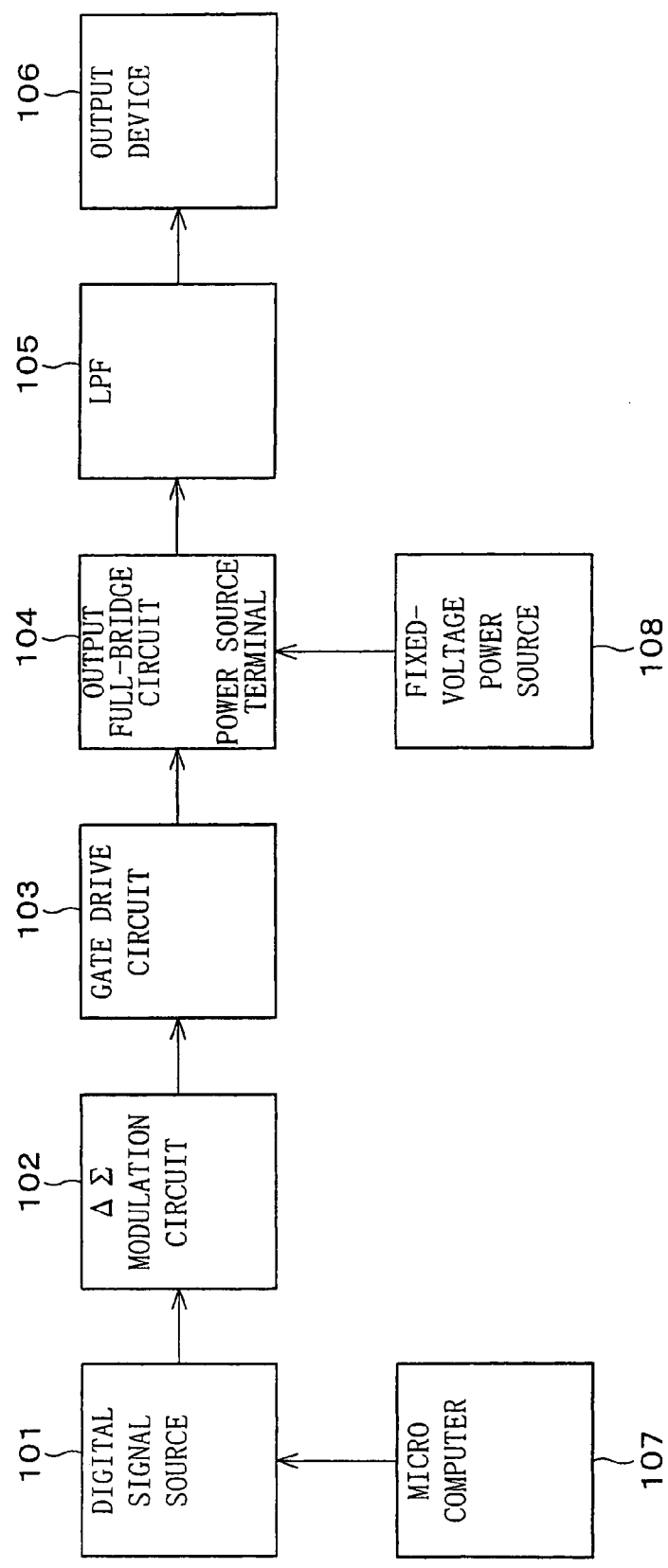
FIG. 8 is a block diagram showing an arrangement of a conventional digital amplifier.
Figure 9:
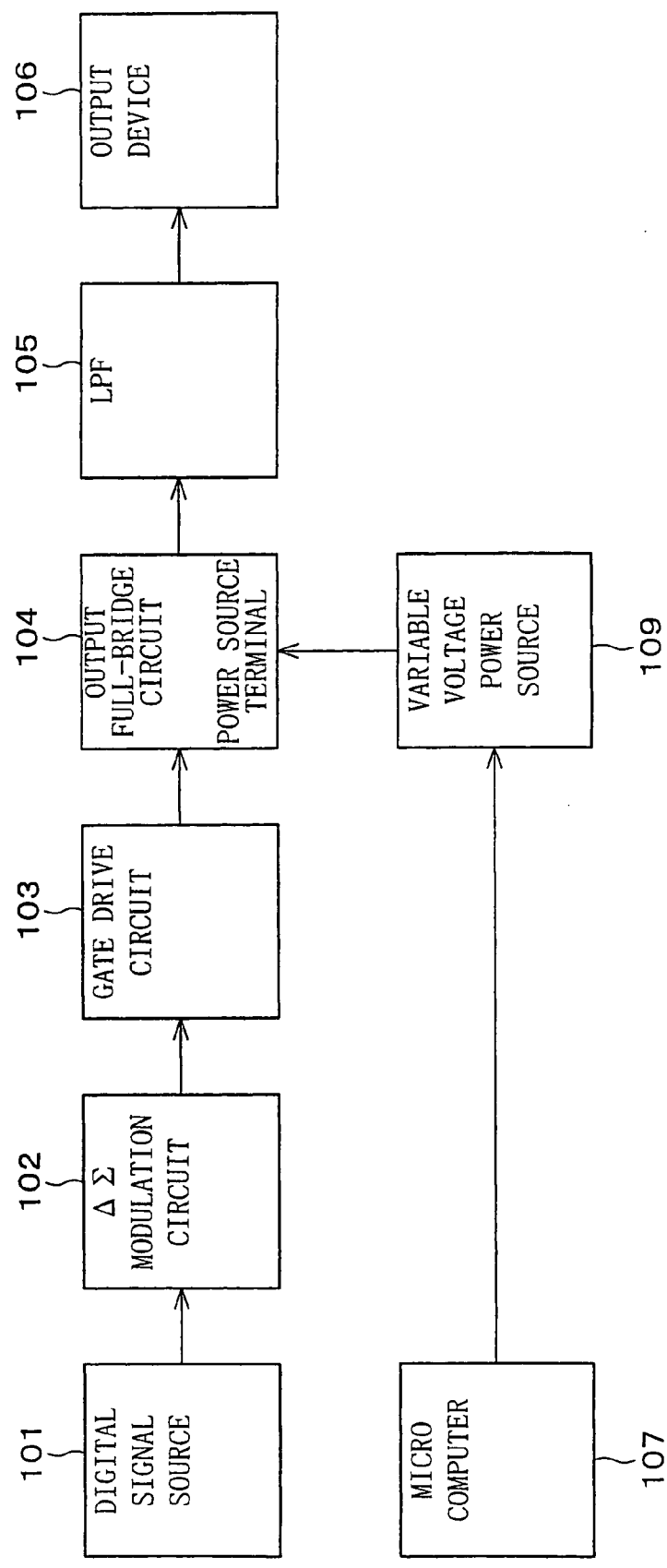
FIG. 9 is a block diagram showing another conventional digital amplifier.
Figure 10:
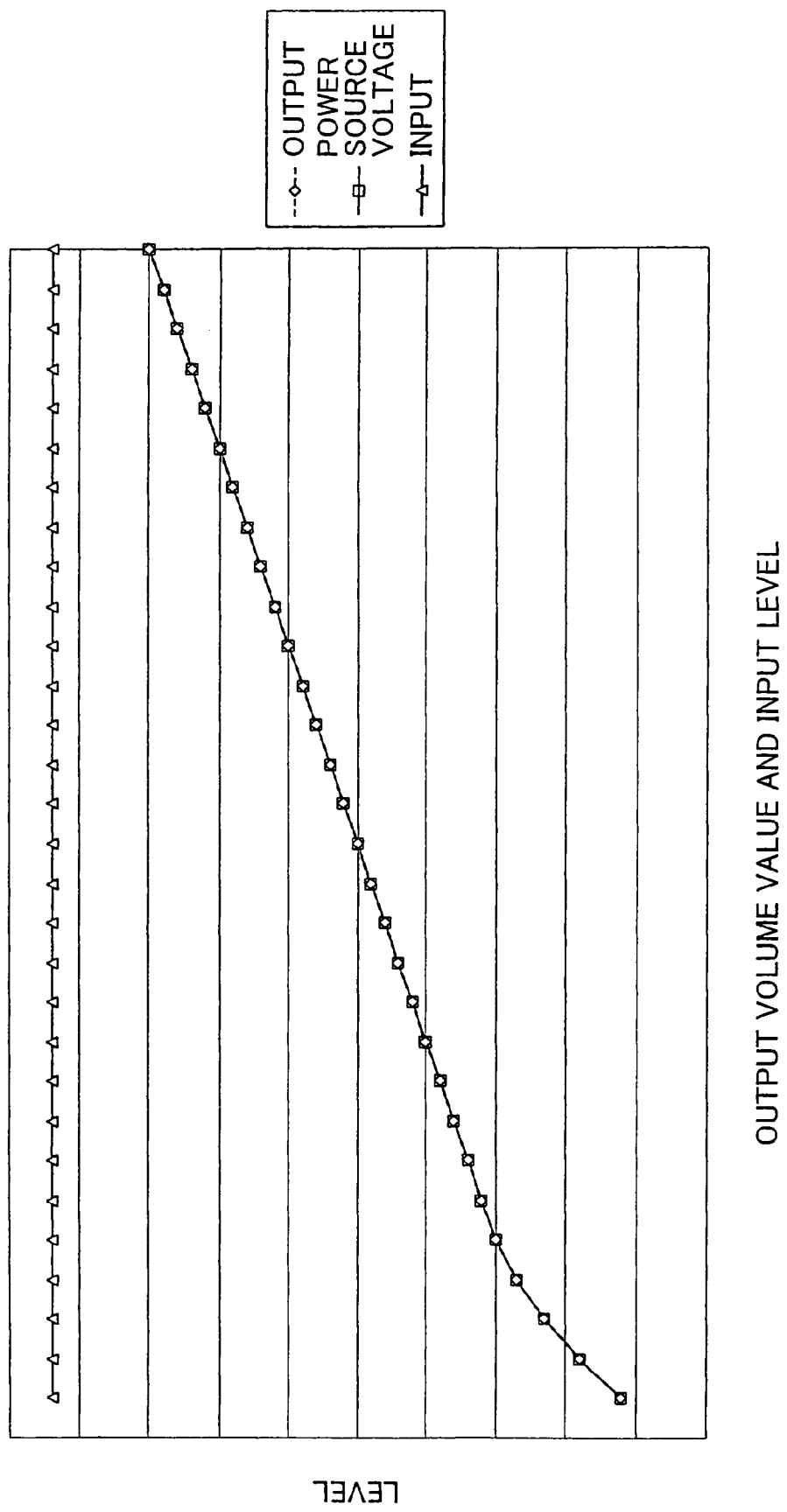
FIG. 10 is a graph showing a control property for controlling volume of the digital amplifier of FIG. 9.
Figure 11:
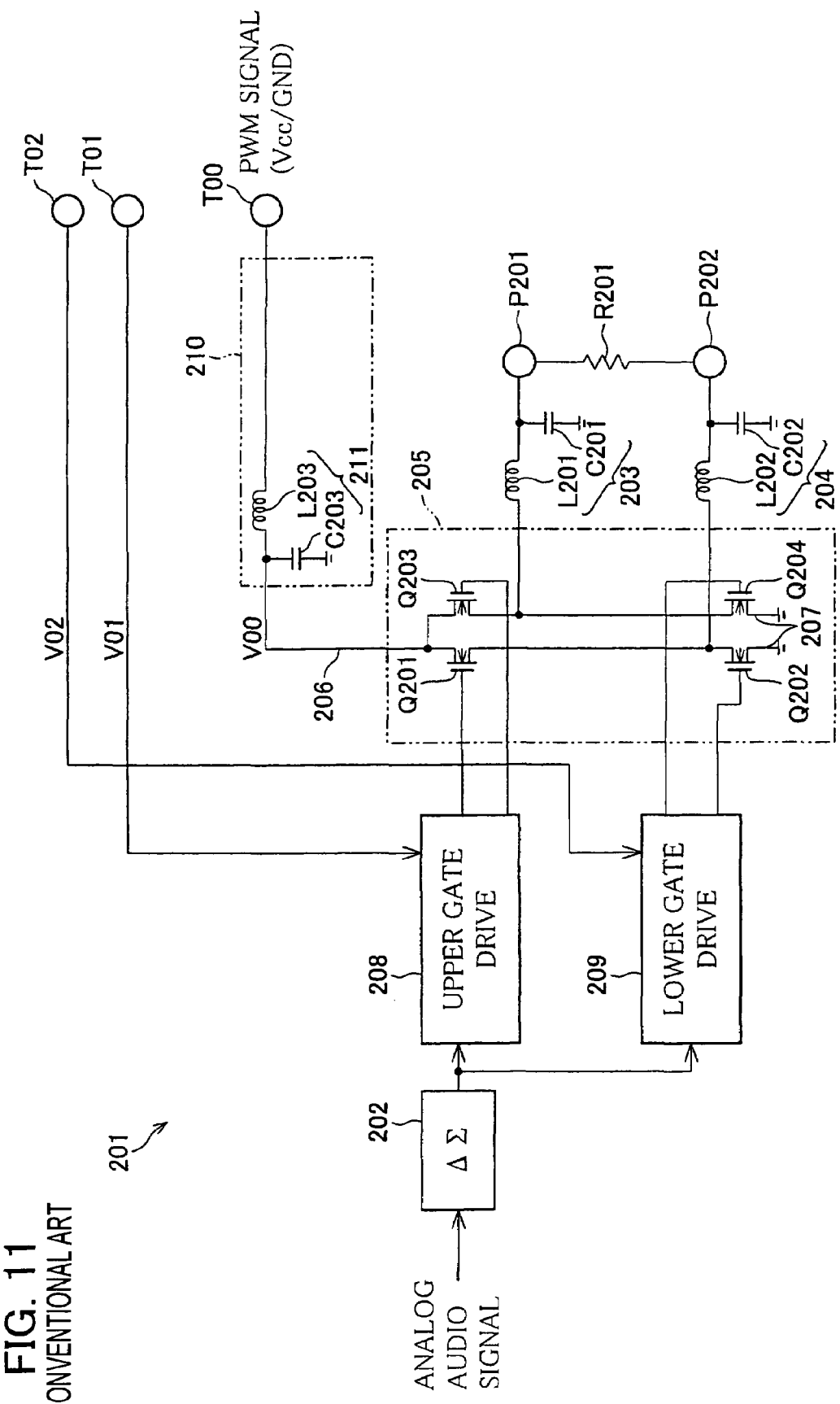
FIG. 11 is a block diagram showing an arrangement of still another digital amplifier.

The following description will explain still another example of the present invention with reference to FIG. 7.

FIG. 7 is a block diagram showing a minidisk device as a digital signal storage/reproduction device of the present example.

As shown in FIG. 7, in the minidisk device, a disk 41 which is a rewritable magnet-optical storage medium is used. First, specifications of storage/reproduction of the disk 41 is described. A whole storage surface of the disk 41 stores sound data such as tunes, i.e., data set, constituted of information datum related to each other, in which addresses with sequential numbers have been set in advance as storage units.

Further, the storage surface of the disk 41 has a U-TOC (User-Table Of Content) region, described later, which stores (i) information of address numbers of tunes and (ii) list information such as a title of the tune and a tune number (set number) both of which facilitate retrieval of stored tunes.

Specifications of the storage/reproduction of the disk 41 is detailed as follows. First, in the disk 41, there are sequentially provided (i) a read-in region for exclusively reading, (ii) a rewritable U-TOC region (list information) positioned in a circle portion right behind of the read-in region, (iii) a program area for storing sound data and sub-data positioned outside the U-TOC region, and (iv) a read-out region positioned in an outermost periphery.

In the minidisk device, an optical pick up 42 for reproducing the sound data from the storage surface of the disk 41 is provided, and the optical pick up 42 is also used to store new sound data onto the disk 41.

Further, the minidisk device includes an RF amplifier 43, an encoder/decoder·signal processing circuit 44, a shock-proof memory controller (hereinafter, referred to as memory controller) 45, a shock-proof memory 46, a sound development/compression circuit 47, a D/A·A/D converter 48, a system controller (control means) 49 such as a micro computer, and a servo circuit 50.

Moreover, the minidisk device includes a driving circuit 51, a spin motor 52, a transport motor 53, a power ON/OFF circuit 54, a head driving section 55, a storage head 56, a sound output terminal 57, a sound input terminal 58, an input section 59, and a digital amplifier 60.

The input section 59 includes: a tune rewriting key 59a for giving instruction to rewrite a stored tune into a new tune; tune-specifying numerical keys/all-tune-specifying numerical keys (specifying section) 59b for specifying a tune number of a tune, that is to be rewritten, so as to give instruction to rewrite all the tunes; and a control key 59c.

Note that, the control key 59c is used to give instruction to carry out a general function, that is, a storage/reproduction function as a storage/reproduction device for storing/reproducing and the like, and includes a storage key, a pause key, a reproduction key, and a stop key, that are not shown.

The digital amplifier 60 is constituted of the digital amplifier 21 shown in FIG. 1 and the digital amplifier 11 shown in FIG. 3 or the digital amplifier 12 shown in FIG. 6, and converts an analog audio signal outputted to the sound output terminal 57 into a 1-bit digital signal so as to perform amplification with high efficiency. Further, the digital amplifier 60 constituted of the digital amplifier 11 can also convert a multi-bit digital audio signal outputted from the sound compression/development circuit 47 directly into a 1-bit digital audio signal.

When reproducing data of the disk 41 in the minidisk device, the disk 41 is rotationally driven by the spin motor 52 driven by the driving circuit 51, and the pick up 42 is transported in a radius direction of the disk 41 by the transport motor 53 driven by the driving circuit 51, and the pick up 42 reads out sound data stored in the disk 41.

The sound data read out by the pick up 42 is amplified by the RF amplifier 43, and is transmitted to the encoder/decoder signal processing circuit 44. Moreover, the RF amplifier 43 generates a servo control signal such as a focus error signal and a tracking error signal in accordance with the sound data read out by the pick up 42, and outputs the servo control signal to the servo circuit 50.

The servo circuit 50 controls the driving circuit 51 so as to servo the pick up 42 in focusing and tracking and so as to servo the spin motor 52 in accordance with a servo control signal outputted from the RF amplifier 43 and a control signal outputted from the system controller 49 constituted of a micro computer and the like. Further, the driving circuit 51 drives the pick up 42, the transport motor 53, and the spin motor 52, in accordance with a control signal outputted from the servo circuit 50.

The encoder/decoder signal processing circuit 44 demodulates a signal that has been amplified by the RF amplifier 43, and further performs a signal processing such as error correction, so as to transmit the signal to the memory controller 45.

As writing means, the memory controller 45 writes the signal transmitted from the encoder/decoder signal processing circuit 44 in the shock-proof memory 46 which functions as storage means. Further, the memory controller 45 reads out sound data stored in the shock-proof memory 46 as memory reading means, and transmits the sound data to the sound development/compression circuit 47.

The sound development/compression circuit 47 demodulates the sound data by causing a sound data development circuit provided therein to perform time-based development with respect to the sound data in accordance with a predetermined format, and transmits the sound data to the D/A·A/D converter 48. The D/A·A/D converter 48 causes a D/A converter 48a provided therein to converts the inputted digital data into analog data, so as to generate a sound signal. Then, the sound signal is outputted from the output terminal 57 as a sound output.

Meanwhile, when storing data, a sound signal inputted from the sound input terminal 58 is transmitted to the D/A·A/D converter 48, and the sound signal which is an analog signal is converted into a digital sound signal by an A/D converter 48b provided therein, and the sound data is transmitted to the sound development/compression circuit 47.

The sound development/compression circuit 47 causes a sound compression circuit provided therein to compress the inputted sound data into approximately 1/5 on the basis of the minidisk device's information compression technique referred to as "ATRAC (Adaptive TRansform Acoustic Coding)", and thus compressed sound data is transmitted to the memory controller 5.

The memory controller 45 writes thus transmitted sound data in the shock-proof memory 46. Further, the memory controller 45 reads out the sound data stored in the shock-proof memory 46, and transmits the sound data to the encoder/decoder signal processing circuit 44, and the encoder/decoder signal processing circuit 44 modulates the sound data and adds a correction code and the like to the sound data. Such sound data is transmitted to a head driving section 55.

The head driving section 55 outputs a digital signal to a storage head 56 in accordance with the sound data, and drives the storage head 56 in accordance with a control signal outputted from the system controller 49. Meanwhile, the head driving section 55 causes the pick up 42 to emit laser, whose intensity is higher than that of laser emitted in reproduction, onto the disk 41's portion to which a magnetic field is applied by the storage head 56, so that the sound data is sequentially stored in predetermined addresses of the disk 41. Note that, the intense laser emitted from the pick up 42 is controlled by the system controller 49 via the power source ON/OFF circuit 54 and the driving circuit 51.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

For example, in case where the digital signal storage/reproduction device of Example 3 is a cellular phone, it is necessary that the device is driven at limited power for a long time, so that the techniques for reducing the power consumption that has been described in Examples 1 and 2 are particularly effective.

INDUSTRIAL APPLICABILITY

As described above, the present invention adopts an arrangement for reducing power required in a digital amplifier when turning down the volume. Thus, when this technique is applied to a digital audio reproduction device and the like, this contributes to reduction of the power consumption, so that such arrangement is useful. Further, the present invention adopts an arrangement for reducing a distortion scale factor within a range of a lower output volume value. Thus, when this technique is applied to a digital audio reproduction device and the like, it is possible to improve an audio performance, so that such arrangement is useful.

The invention claimed is:

1. A digital amplifier, in which a driving circuit drives switching elements in response to an audio signal that has been converted into a 1-bit signal, and an amplitude of the audio signal is amplified by switching a power source voltage, comprising:
   variable power source voltage generating means for generating the power source voltage which is variable; and
   driving voltage variation means for causing a driving voltage, by which the driving circuit drives the switching elements, to follow the power source voltage so as to vary the driving voltage.

2. The digital amplifier as set forth in claim 1, wherein:
   the variable power source voltage generating means includes a low pass filter for smoothing a pulse width modulation signal obtained by switching a predetermined direct current voltage in a duty variable manner, and
   the driving voltage variation means includes:
   a capacitor whose one terminal receives the pulse width modulation signal;
   a diode for inputting a predetermined constant voltage into another terminal of the capacitor; and
   a low pass filter for smoothing an output from the other terminal of the capacitor, wherein a voltage obtained by adding the constant voltage to the power source voltage is supplied to the driving circuit as the driving voltage.

3. A digital signal reproduction device, comprising:
   a reproduction circuit for demodulating and developing sound data, obtained from a rewritable optical storage medium, which has been modulated and compressed for storage; and
   an amplifier for amplifying the sound data, wherein
   the amplifier is a digital amplifier that includes a driving circuit driving switching elements in response to an audio signal that has been converted into a 1-bit signal, and an amplitude of the audio signal is amplified by switching a power voltage,
   a variable power source voltage generator generating the power source voltage which is variable, and
   a driving voltage variator that causes a driving voltage, by which the driving circuit drives the switching elements, to follow the power source voltage so as to vary the driving voltage.

4. The digital signal reproduction device as set forth in claim 3, wherein the optical storage medium is a minidisk.

5. The digital signal reproduction device as set forth in claim 3, wherein
   the variable power source voltage generating means includes a low pass filter for smoothing a pulse width modulation signal obtained by switching a predetermined direct current voltage in a duty variable manner, and the driving voltage variation means includes:

a capacitor whose one terminal receives the pulse width modulation signal;

a diode for inputting a predetermined constant voltage into another terminal of the capacitor; and a low pass filter for smoothing an output from the other terminal of the capacitor, wherein a voltage obtained by adding the constant voltage to the power source voltage is supplied to the driving circuit as the driving voltage.

* * * * *